(12) United States Patent
Yoon et al.

(10) Patent No.: US 9,324,416 B2
(45) Date of Patent: Apr. 26, 2016

(54) PSEUDO DUAL PORT MEMORY WITH DUAL LATCH FLIP-FLOP

(71) Applicant: QUALCOMM Incorporated, San Diego, CA (US)

(72) Inventors: Sei Seung Yoon, San Diego, CA (US); Tony Chung Yiu Kwok, San Diego, CA (US); Changho Jung, San Diego, CA (US); Nishith Nitin Desai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/464,627

(22) Filed: Aug. 20, 2014

(65) Prior Publication Data

US 2016/0055903 A1    Feb. 25, 2016

(51) Int. Cl.
| | |
|---|---|
| G11C 16/04 | (2006.01) |
| G11C 11/419 | (2006.01) |
| G11C 7/10 | (2006.01) |
| G11C 7/22 | (2006.01) |

(52) U.S. Cl.
CPC ............ *G11C 11/419* (2013.01); *G11C 7/1087* (2013.01); *G11C 7/1072* (2013.01); *G11C 7/22* (2013.01)

(58) Field of Classification Search
CPC ...... G11C 7/22; G11C 7/1006; G11C 11/409; G11C 11/419; G11C 7/1087
USPC .......... 365/189.05, 154, 233.11, 201, 233.16, 365/233.17
See application file for complete search history.

(56) References Cited

U.S. PATENT DOCUMENTS

| | | | |
|---|---|---|---|
| 6,289,477 B1 * | 9/2001 | Gunadisastra . | G01R 31/318541 324/750.3 |
| 6,489,825 B1 * | 12/2002 | Pasqualini ............. | H03K 3/012 327/201 |
| 7,350,092 B2 * | 3/2008 | Reichel ..................... | G06F 1/12 365/233.1 |
| 7,533,222 B2 | 5/2009 | Leung | |
| 8,374,050 B2 | 2/2013 | Zhou et al. | |
| 8,630,143 B2 | 1/2014 | Nukaraju et al. | |
| 8,711,645 B2 | 4/2014 | Chakravarty | |
| 8,717,829 B2 * | 5/2014 | Sharma .................. | G11C 29/32 365/189.05 |
| 8,958,254 B2 * | 2/2015 | Joshi .................... | G11C 11/419 365/189.05 |
| 2007/0109909 A1 | 5/2007 | Jung et al. | |
| 2009/0231937 A1 | 9/2009 | Jung et al. | |
| 2011/0051537 A1 | 3/2011 | Jung et al. | |
| 2013/0215689 A1 | 8/2013 | Joshi et al. | |

OTHER PUBLICATIONS

International Search Report and Written Opinion—PCT/US2015/041103—ISA/EPO—Oct. 15, 2015.

* cited by examiner

*Primary Examiner* — David Lam
(74) *Attorney, Agent, or Firm* — Arent Fox LLP

(57) ABSTRACT

A memory and a method for operating the memory provided. In one aspect, the memory may be a PDP memory. The memory includes a control circuit configured to generate a first clock and a second clock in response an edge of a clock for an access cycle. A first input circuit is configured to receive an input for a first memory access based on the first clock. The first input circuit includes a latch. The second input circuit configured to receive an input for a second memory access based on the second clock. The second input circuit includes a flip-flop.

27 Claims, 7 Drawing Sheets

PSEUDO DUAL PORT MEMORY WITH DUAL LATCH FLIP-FLOP

BACKGROUND

1. Field

The present disclosure relates generally to electronic circuits, and more particularly, to pseudo dual port (PDP) memories.

2. Background

Many applications require the functionality of a dual port memory, e.g., a memory capable of handling both a read and a write operation within a single clock cycle. A dual port memory typically includes two ports operating with an array of memory cells, which may be simultaneously accessed from both ports. For example, a dual port memory may access two different memory locations (addresses) in a single cycle. In order to reduce the size of the memory, a pseudo-dual port or PDP memory may be used to replace a dual port memory. The core of the PDP memory may be a single-core memory. Accordingly, the memory array of the PDP memory may allow for a single memory access at one instance and not two simultaneous memory accesses as with the dual port memory. The PDP memory may emulate the dual port memory in having two ports. In one implementation, the PDP memory may receive a clock for an access cycle and sequentially perform two memory accesses in that access cycle.

SUMMARY

Aspects of a memory are disclosed. The memory includes a control circuit configured to generate a first clock and a second clock in response an edge of a clock for an access cycle. A first input circuit is configured to receive an input for a first memory access based on the first clock. The first input circuit includes a latch. A second input circuit is configured to receive an input for a second memory access based on the second clock. The second input circuit includes a flip-flop.

Further aspects of a memory are disclosed. The memory includes a control means for generating a first clock and a second clock in response an edge of a clock for an access cycle. A first input means for receiving an input for a first memory access based on the first clock is provided. The first input means includes a latch. A second input means or receiving an input for a second memory access based on the second clock is provided. The second input means includes a flip-flop.

Aspects of a method for operating a memory are disclosed. The method includes generating a first clock and a second clock in response to an edge of a clock for an access cycle and receiving, by a first input circuit, an input for a first memory access based on the first clock. The first input circuit includes a latch. The method further includes receiving, by a second input circuit, an input for a second memory access based on the second clock. The second input circuit includes a flip-flop.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
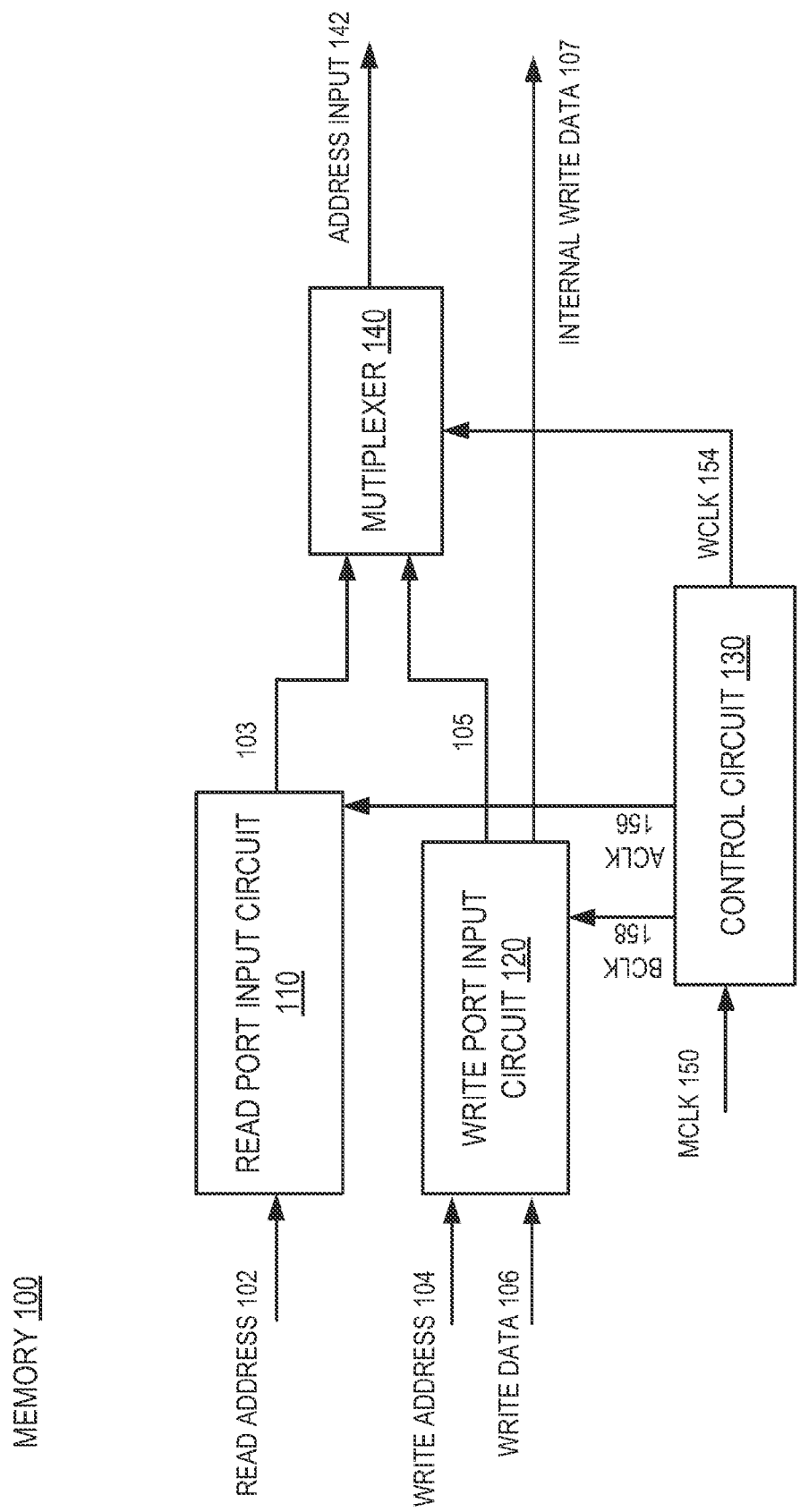
FIG. 1 is a functional block diagram illustrating an exemplary embodiment of a PDP memory interface.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various apparatus and methods presented throughout this disclosure may be implemented in various forms of hardware. By way of example, any of these apparatus or methods, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, personal digital assistant (PDA), laptop computer, a desktop computer (PC), a computer peripheral device, a multimedia device, a video device, an audio device, a global positioning system (GPS), a wireless sensor, or any other suitable device.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory, such as a PDP memory, are provided. Such memory may be a standalone memory or be embedded on a system-on-chip (SOC) processor for a communication apparatus (such as mobile phone). However, as those skilled in the art will readily appreciate, aspects and applications of the disclosure may not be limited thereto. Accordingly, all references to a specific application for a memory are intended only to illustrate exemplary aspects of the memory with the understanding that such aspects may have a wide differential of applications.

FIG. 1 is a functional block diagram illustrating an exemplary embodiment of a PDP memory interface. The memory 100 provides a medium for peripheral circuits to write and read program instructions and data and may include a PDP memory having two ports. As used hereinafter, the term "data" will be understood to include program instructions, data, and any other information that may be stored in the memory 100. The memory array (see FIG. 3) of the memory 100 operates as a single port memory in that only one memory location (e.g., address) is accessed at one time. The memory 100 mimics a dual port memory and includes two ports. The memory 100 includes a read port input circuit 110 configured to receive the read address 102 and a write port input circuit 120 configured to receive the write address 104 and the write data 106. A control circuit 130 receives a master clock MCLK 150, which initiates the access cycle. The control circuit 130 may include logic gates to perform the functions described herein, processor(s) performing those functions, logic gates generating the signals described herein, or combinations thereof. In one example, the memory 100 may perform a read memory access and then a write memory access in one access cycle. Based on the MCLK 150, the control circuit 130 generates the clock signal ACLK 156, which enables the read port input circuit 110 to receive the read address 102, and the clock signal BCLK 158, which enables the write port input circuit 120 to receive the write address 104 and the write data 106. The function of receiving the inputs (e.g., read address 102, write address 104, and write data 106) may include storing the inputs for internal operations of the memory 100. The read port input circuit 110 outputs the received read address 102 as the internal read address 103. The write port input circuit 120 outputs the received write address 104 as the internal write address 105 and the received write data 106 as the internal write data 107. In one implementation, the rising edge of the MCLK 150 is used to generate the clock signal ACLK 156 and to initiate a read memory access using the read address 102. In one implementation, the falling edge of the clock signal BCLK 158 initiates a write memory access.

The internal read address 103 (stored by the read port input circuit 110) and the internal write address 105 (stored by the write port input circuit 120) are provided to the multiplexer 140. The access cycle of the memory 100 may be a read memory access or a write memory access. Based on the memory access type, the control circuit 130 generates a clock WCLK 154 for the multiplexer 140 to select among the internal read address 103 and the internal write address 105. The selected address is outputted as the address input 142 to the memory array (see FIG. 3) of the memory 100. Likewise, the internal write data 107 is provided to the memory array (see FIG. 3) of the memory 100 as selected by the WCLK 154.

Figure 2:
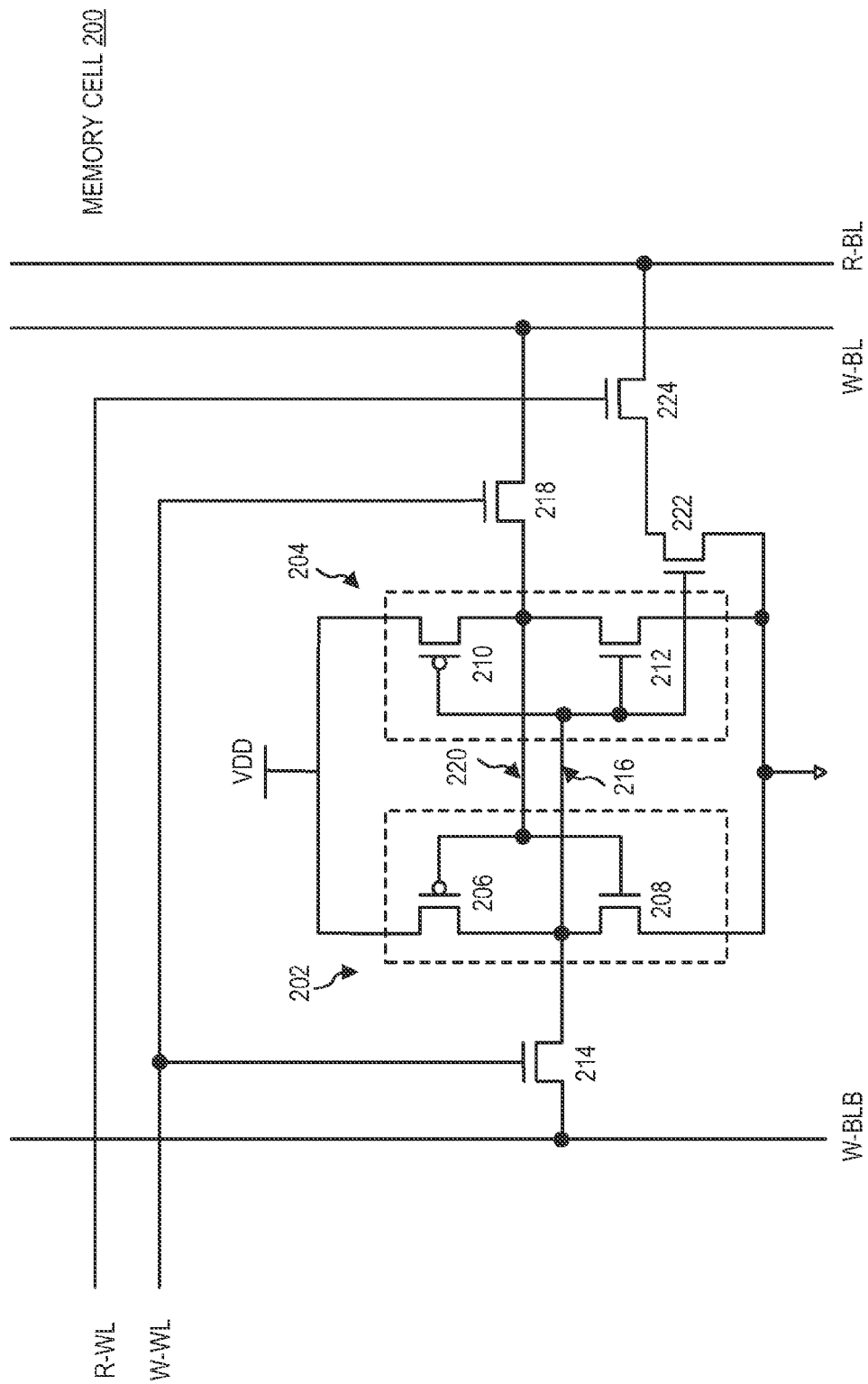
FIG. 2 is a schematic representation of an exemplary embodiment of a memory cell for the PDP memory.

The memory 100 may be any suitable storage medium, such as, by way of example, a static random access memory (SRAM). SRAM is volatile memory that requires power to retain data. However, as those skilled in the art will readily appreciate, the memory 100 is not necessarily limited to SRAM. Accordingly, any reference to SRAM is intended only to illustrate various concepts, with the understanding that such concepts may be extended to other memories. SRAM includes an array of storage elements know as memory cells. Each memory cell is configured to store one bit of data. FIG. 2 is a schematic representation of an exemplary embodiment of a memory cell for the PDP memory. In the example, the memory cell 200 is an SRAM cell. The memory cell 200 is implemented with an eight-transistor (8T) configuration. However, as those skilled in the art will readily appreciate, the memory cell 200 may be implemented with a four-transistor (4T), six-transistor (6T), ten-transistor (10T) configuration, or any other suitable transistor configuration.

The memory cell 200 is shown with two inverters 202, 204. The first inverter 202 comprises a P-channel transistor 206 and an N-channel transistor 208. The second inverter 204 comprises a P-channel transistor 210 and an N-channel transistor 212. The first and second inverters 202, 204 are interconnected to form a cross-coupled latch. A first N-channel write access transistor 214 couples the output 216 from the first inverter 202 to a first local write bitline W-BLB and a second N-channel write access transistor 218 couples the output 220 from the second inverter 204 to a second local write bitline W-BL. The gates of the N-channel write access transistors 214, 218 are coupled to a write wordline W-WL. The output 216 from the first inverter 202 is also coupled to the gate of an N-channel transistor 222. An N-channel read access transistor 224 couples the output from the N-channel transistor 222 to a local read bitline R-BL. The gate of the N-channel read access transistor 224 is coupled to a read wordline R-WL.

The write operation is initiated by setting the local write bitline pair W-BLB, W-BL to the value to be written to memory cell 200 and then asserting the write wordline W-WL. By way of example, a logic level 1 may be written to the memory cell 200 by setting the first local write bitline W-BLB to a logic level 0 and the second local write bitline W-BL to a logic level 1. The logic level 0 at the first local write bitline W-BLB is applied to the input of the second inverter 204 through the write access transistor 214, which in turn forces the output 220 of the second inverter 204 to a logic level 1. The output 220 of the second inverter 204 is applied to the input of the first inverter 202, which in turn forces the output 216 of the first inverter 202 to a logic level 0. A logic level 0 may be written to the memory cell 200 by inverting the values of the local write bitlines W-BLB, W-BL. The local write bitline drivers (not shown) are designed to be much stronger than the transistors in the memory cell 200 so that they can override the previous state of the cross-coupled inverters 202, 204.

The read operation is initiated by precharging the local read bitline R-BL to a logic level 1 and then asserting the read wordline R-WL. With the read wordline asserted, the output from the N-channel transistor 222 is transferred to the local read bitline R-BL through the read access transistor 224. By way of example, if the value stored at the output 220 of the second inverter 204 is a logic level 0, the output 216 from the first inverter 202 forces the N-channel transistor 222 on, which in turn causes the local read bitline R-BL to discharge to a logic level 0 through the read access transistor 224 and the N-channel transistor 222. If the value stored at the output 220 of the second inverter 204 is a logic level 1, the output 216 from the first inverter 202 forces the N-channel transistor 222 off. As a result, the local read bitline R-BL remains charged to a logic level 1.

When the SRAM is in a standby mode, the write wordline W-WL and read wordline R-WL are set to a logic level 0. The logic level 0 causes the write access transistors 214, 218 and the read access transistor 224 to disconnect the local write and read bitlines W-BL, W-BLB, R-BL from the two inverters 202, 204. The cross-coupling between the two inverters 202, 204 maintains the state of the output as long as power is applied to the memory cell 200.

Figure 3:
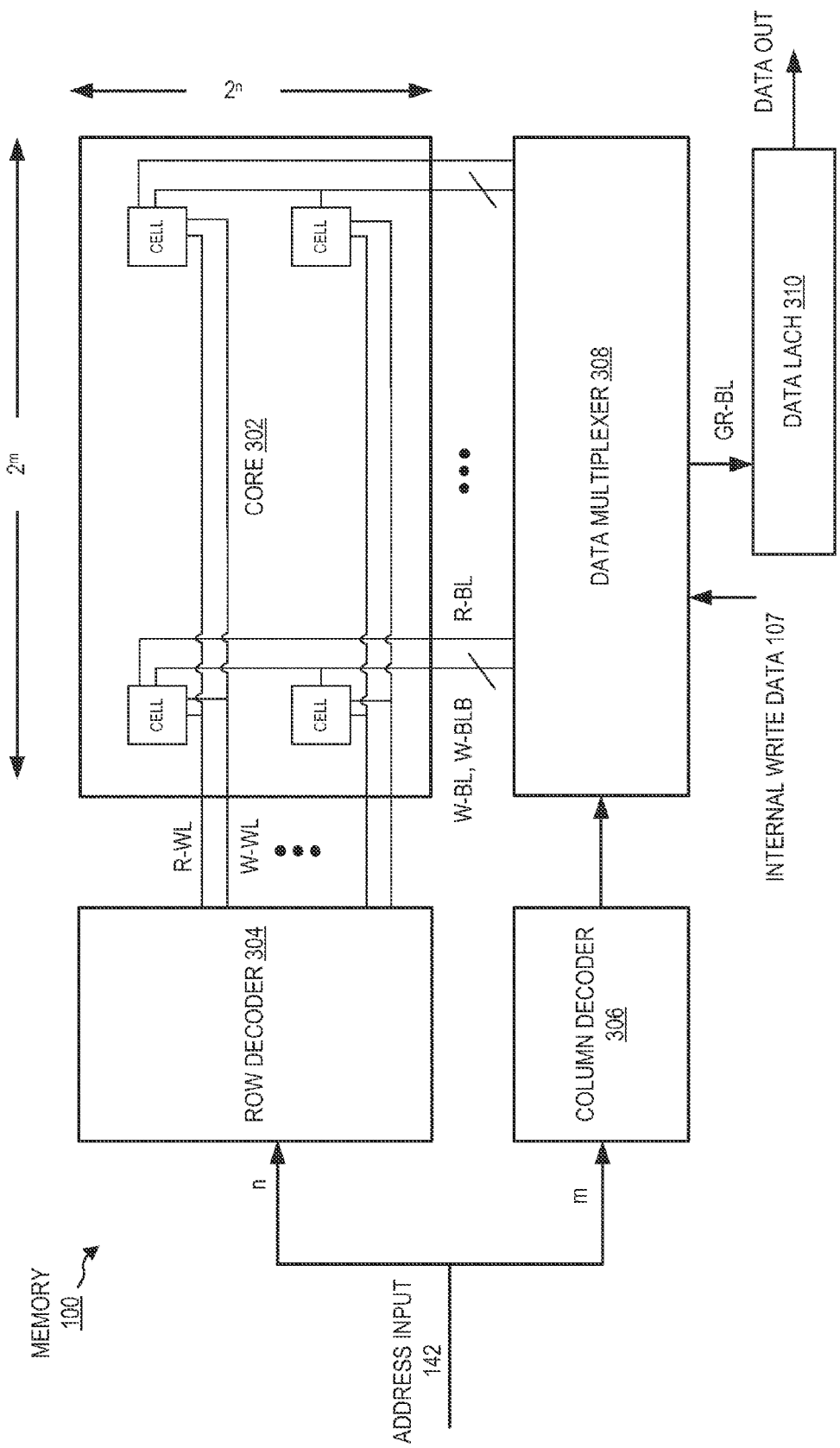
FIG. 3 is a functional block diagram of an exemplary embodiment of a PDP memory array.

FIG. 3 is a functional block diagram of an exemplary embodiment of a PDP memory array. To meet the demands of the PDP function, the memory array is a single-port memory operating two memory accesses in an access cycle. In one example, the memory array operates with a single address decoder (e.g., row decoder 304 and column decoder 306) which decodes one address (e.g., address input 142) at one time. The memory 100 includes a memory core 302 with supporting circuitry to decode addresses and perform read and write operations. The memory core 302 is comprised of memory cells arranged to share connections in horizontal rows and vertical columns. Specifically, each horizontal row of memory cells shares a read wordline R-WL and a write wordline W-WL and each vertical column of memory cells shares a local read bitline R-BL and a write bitline pair W-BL, W-BLB. The size of the memory core 302 (i.e., the number of memory cells) may vary depending on a variety of factors including the specific application, the speed requirements, the layout and testing requirements, and the overall design constraints imposed on the system. Typically, the memory core 302 will contain thousands or millions of memory cells.

In the exemplary embodiment of the PDP memory array shown in FIG. 3, the memory core 302 is made up of ($2^n \times 2^m$) memory cells 200 arranged in $2^n$ horizontal rows and $2^m$ vertical columns. The received address input 142 (FIG. 1) may be (n+m) bits wide. In this example, n-bits of the address are provided to the input of a row decoder 304 and m-bits of the address are provided to the input of a column decoder 306. The memory 100 is placed into a read mode or a write mode by the read/write enable signal (not shown).

For a read memory access, the row decoder 304 converts the n-bit address into one of the $2^n$ read wordlines. A different read wordline R-WL is asserted by the row decoder 304 for each different n-bit row address. As a result, each of the $2^m$ memory cells in the horizontal row with the asserted read wordline R-WL is connected to one of the $2^m$ read bitlines R-BL through its access transistor as described above in connection with FIG. 2. The $2^m$ read bitlines R-BL are used to transmit the bits stored by the m memory cells to the data multiplexer 308 that selects one or more bits from the $2^m$ bits transmitted on the read bitlines R-BL. The number of bits that are selected by the data multiplexer 308 is based on the width of the memory 100 output. By way of example, the data multiplexer 308 may select 64 of the $2^m$ bits to support the memory 100 having a 64-bit output and output the selected data as the global read bitlines GR-BL. In the described exemplary embodiment, the data multiplexer 308 selects a set of data (e.g., 32 or 64 bits) from among the $2^m$ bits. The selected data GR-BL (from the selected read bitlines R-BL) are provided to the data latch 310 for outputting the data out.

For a write memory access, the row decoder 304 converts the n-bit address into one of the $2^n$ write wordlines W-WL. A different write wordline W-WL is asserted by the row decoder 304 for each different n-bit row address. As a result, each of the $2^m$ memory cells in the horizontal row with the asserted write wordline W-WL is connected to one of the $2^m$ write bitline pairs W-WL, W-WLB through its access transistors as described above in connection with FIG. 2. The $2^m$ write bitline pairs W-WL, W-WLB provide the internal write data 107 (FIG. 1) to the m memory cells for the write memory access. The data multiplexer 308 receives the internal write data 107 and selects write bitline pairs W-WL, W-WLB from among the $2^m$ write bitline pairs W-WL, W-WLB, based on the $2^m$ address decoding from the column decoder 306. The data multiplexer 308 provides the received internal write data 107 onto the selected write bitline pairs W-WL, W-WLB.

Figure 4:
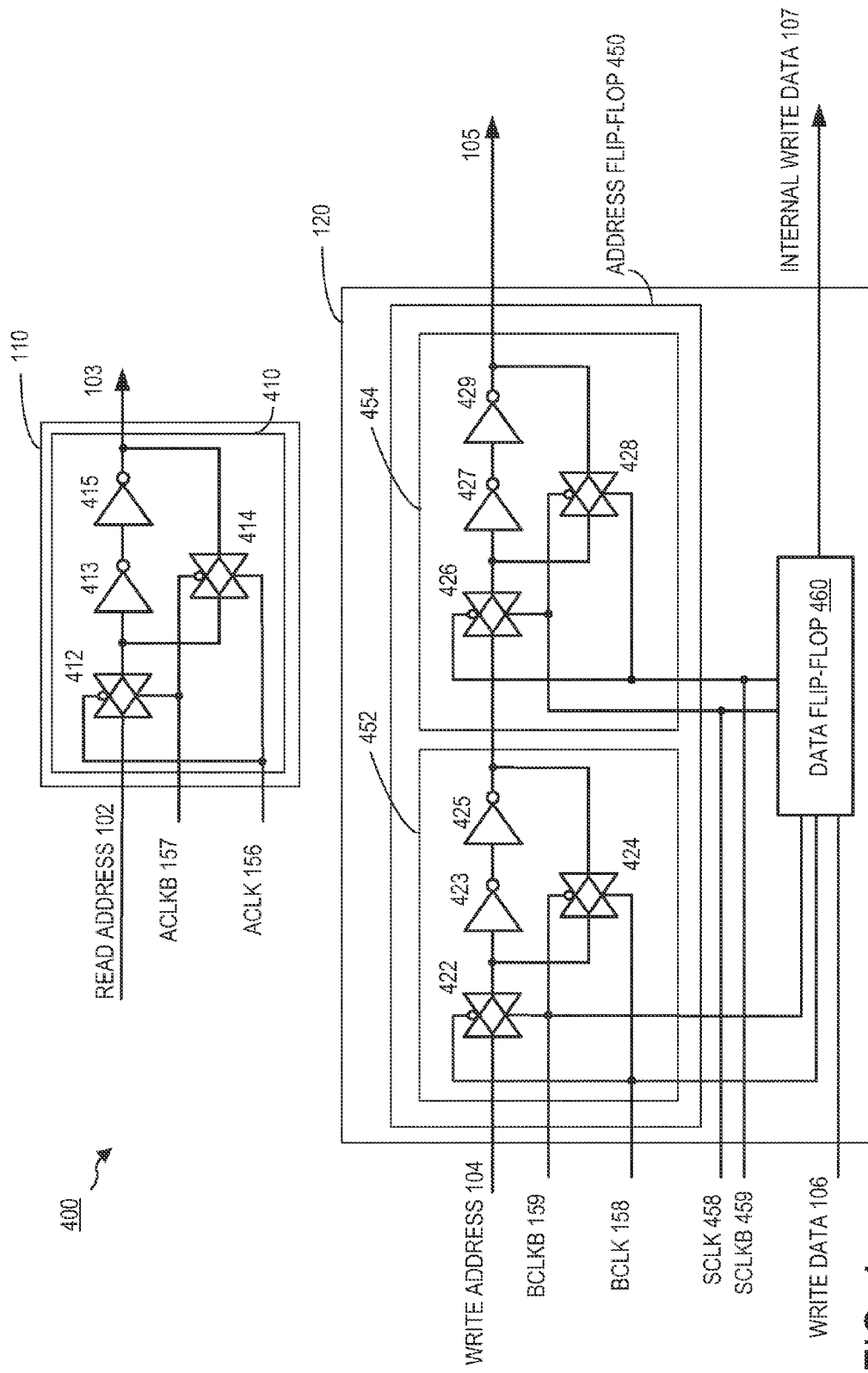
FIG. 4 is a schematic diagram illustrating an exemplary embodiment of input circuits of a PDP memory.
Figure 5:
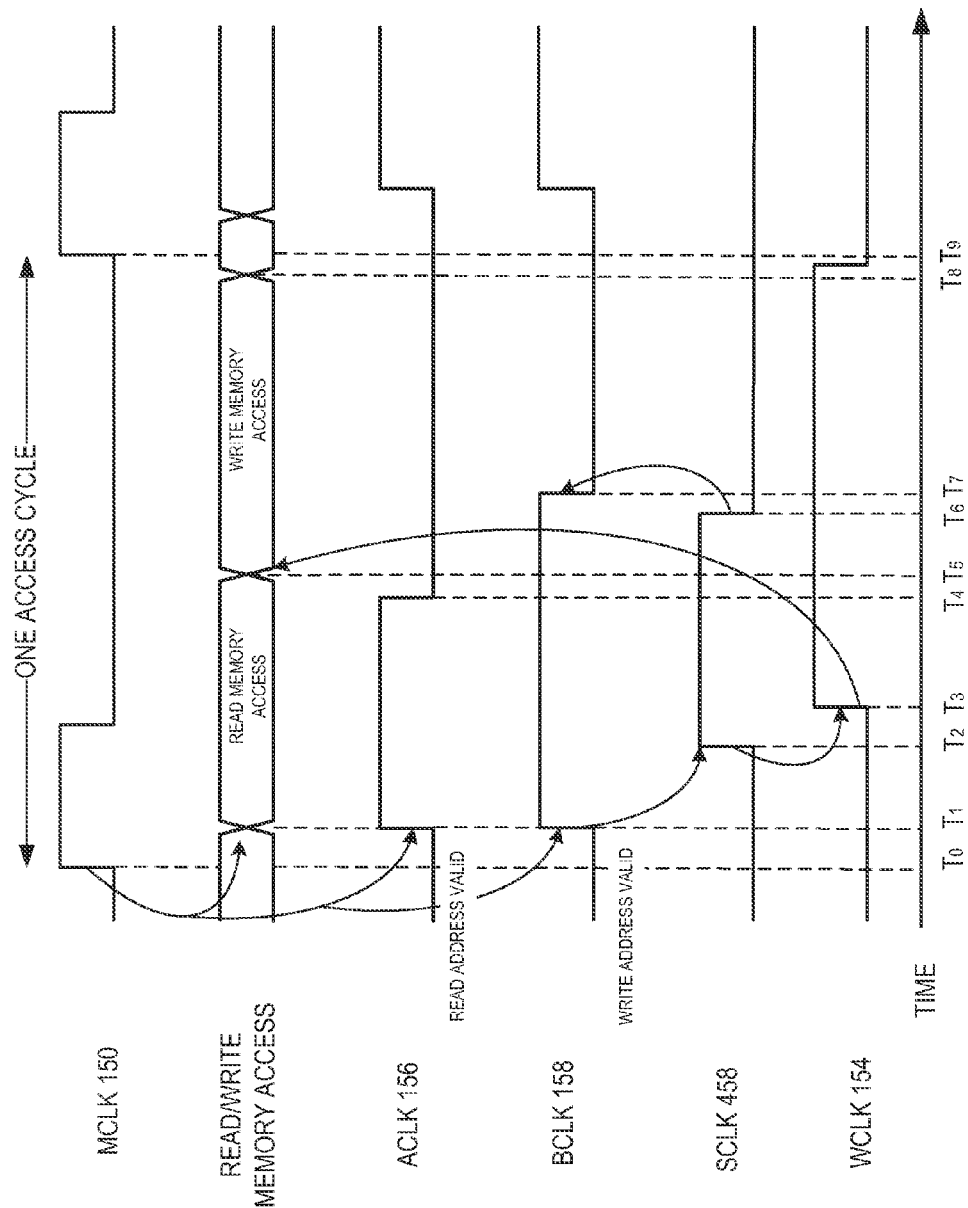
FIG. 5 is a timing diagram of operations of an exemplary embodiment of a PDP memory.

FIG. 4 is a schematic diagram illustrating an exemplary embodiment of input circuits of a PDP memory. FIG. 5 is a timing diagram of operations of an exemplary embodiment of a PDP memory. Descriptions are provided below with reference both FIGS. 4 and 5 for clarity. Referring to FIG. 5, at $T_0$, the master clock MCLK 150 rises (e.g., activates) to initiate the access cycle ($T_0$-$T_9$). Within the one access cycle, the memory 100 may perform two memory accesses. The first memory access is a read memory access ($T_1$-$T_5$). The second and subsequent memory access is a write memory access ($T_5$-$T_8$). In response to the rising edge of the MCLK 150 at $T_0$, the control circuit 130 may generate the clock signals ACLK 156 and BCLK 158 at $T_1$. (However, of course, the clock signals ACLK 156 and BCLK 158 need not rise or activate at the same time.) Subsequently, the clock signal ACLK 156 goes low (e.g., deactivates) at $T_4$, and the clock signal BLCK 158 goes low (e.g., deactivates) at $T_7$. The control circuit 130 may further generate (e.g., goes high or activates) the clock signal SCLK 458 at $T_2$. The clock signal SCLK 458 goes low (e.g., deactivates) at $T_6$.

Referring to FIG. 4, the diagram 400 includes the read port input circuit 110 and the write port input circuit 120. The read port input circuit 110 and the write port input circuit 120 represent a single bit. In one implementation, for each address bit (e.g., of the address input 142), one instance of the read port input circuit 110 or one instance of the address portion (address flip-flop 450) of the write port input circuit 120 may be provided. For each bit of the write data 106, one instance of the data portion (data flip-flop 460) of the write port input circuit 120 may be provided. The read port input circuit 110 provides the means for receiving the read address 102 for a read memory access in response to the clock signal ACLK 156 and its complementary clock signal ACLKB 157. The read port input circuit 110 includes a latch 410 formed by, e.g., the passgates 412, 414 and the inverters 413, 415. Prior to $T_1$, the passgate 412 is "open" or enabled to allow the read address 102 to flow to the internal read address 103 via the passgate 412 and the inverters 413 and 415. The latch 410 is thus enabled (e.g., in a state for receiving an input) before $T_1$.

At $T_1$, the clock signals ACLK 156 rising and ACLKB 157 falling operate to disconnect the read address 102 from the latch 410 (e.g., by "closing" or disabling the passgate 412). Moreover, the clock signals ACLK 156 rising and ACLKB 157 falling "open" or enable the passgate 414 to latch the inputted read address 102. In this fashion, the read address 102 is allowed to change (e.g., for the next access cycle) after $T_1$. At $T_4$, the clock signal ACLK 156 going low (and ACLKB 157 going high) enables the latch 410 for receiving the new read address 102 (e.g., for the next access cycle). The control circuit 130 provides the means for changing the states of the clock signals ACLK 156 and ACLKB 157 in response to a rising edge (at $T_1$) of the master clock MCLK 150 for the access cycle (using known methods of clock generation in the art).

The write port input circuit 120 provides the means to receive the write address 104 and the write data 106 for the write memory access in response to the clock signal BCLK 158 (activated at $T_1$) and its complement clock signal BCLKB 159. The write port input circuit 120 includes an address flip-flop 450 and a data flip-flop 460. In one implementation, the address flip-flop 450 is a master-slave flip-flop. In one example, a master-slave flip-flop may include a first latch and a second latch operating in complementary states. When the first latch is enabled (e.g., in a state to receive an input) by a master clock for receiving an input, and a second latch controlled by a slave clock may be disabled and disconnected from the first latch. The disconnecting of the second latch releases the first latch for receiving a new input. The address flip-flop 450 includes a first latch 452 formed by, e.g., the passgates 422, 424 and the inverters 423, 425. Prior to $T_1$, the passgate 422 is "open" or enabled to allow the write address 104 to flow to the second latch 454 (which is not "opened" prior to $T_1$) via the passgate 422 and the inverters 423 and 425. The first latch 452 is thus enabled (e.g., in a state for receiving an input) before $T_1$.

At $T_1$, the clock signals BCLK 158 rising and BCLKB 159 falling operate to disconnect the write address 104 from the first latch 452 (e.g., by "closing" or disabling the passgate 422). Moreover, the clock signals BCLK 158 rising and BCLKB 159 falling "open" or enable the passgate 424 to latch the inputted write address 104. In this fashion, the write address 104 is allowed to change (e.g., for the next access cycle) after $T_1$. At $T_7$, the clock signal BCLK 158 going low (and BCLKB 159 going high) enables the first latch 452 for receiving a new write address 104 (e.g., for the next access cycle). The control circuit 130 provides the means for generating the clock signals BCLK 158 and BCLKB 159 in response to a rising edge of the master clock MCLK 150 for the access cycle (using known clock generation methods in the art).

The inverters 423 and 425 output the write address 104 to the second latch 454. The second latch 454 includes the passgates 426, 428 and the inverters 427, 429. The second latch 454 is enabled (e.g., in a state to receive an input) by the clock signals SCLK 458 and its complement clock signal SCLKB 459 at $T_2$. The control circuit 130 provides the means for generating the clock signals SCLK 458 and SCLKB 459 in response to a rising edge of the BCLK 158. In one implementation, the clock signal SCLK 458 rises after a delay from the rising edge (at $T_1$) of the clock signal BCLK 158. At $T_2$, the clock signal SCLK 458 goes high (and SCLKB 459 goes low), and the passgate 426 turns on or "opens," allowing the output of the first latch 452 (e.g., write address 104) to pass to the inverter 427. The passgate 428 turns off or "closes," disconnecting the feedback from the output (the internal write address 105). The inverters 427 and 429 provide the received write address 104 (from the output of the first latch 452) to the internal write address 105. Thus, the write port input circuit 120 is configured to provide the write address 104 to the internal write address 105 for the write memory access in response to the rising edge of the clock signal SCLK 458 (at $T_2$).

When the clock signal SCLK 458 goes low (and SCLKB 459 goes high) at $T_6$, the passgate 428 opens and allows the feedback from the internal write address 105 to latch or store the received write address 104 in the second latch 454. The passgate 426 closes, disconnecting the second latch 454 (and therefore the internal write address 105) from the first latch 452. The period $T_2$-$T_6$ for which the SCLK signal 458 is high need not last long (e.g., long enough to latch the data in the second latch 454).

After $T_6$, the write port input circuit 120 may start to receive a new write address 104 (e.g., allowing the next cycle write address on 104 to flow into the first latch 452), since the internal write address 105 is disconnected from the first latch 452. Accordingly, at $T_7$, the BCLK 158 goes low to enable the first latch 452 to receive the new write address 104 based on the SCLK 458 going low at $T_6$. In this fashion, the period $T_1$-$T_7$ for which the BCLK 158 is high may be reduced. For example, the pulse width of the period $T_1$-$T_7$ (BCLK 158 been high) in the embodiment is based on the pulse width of the period $T_2$-$T_6$ (SCLK 158 been high). As described above, the pulse width of the period $T_2$-$T_6$ for which the SCLK signal 458 is high only need to be as long as needed to latch the data in the second latch 454.

Accordingly, in one implementation, the write port input circuit 120 is configured to receive the write address 104 for the write memory access based on the second latch 454 of the address flip-flop 450 been disconnected from the first latch 452. In one implementation, the write port input circuit 120 is configured to output the received write address 104 (e.g., provided the write address 104 to the internal write address 105) in response to the rising edge of the SCLK 458, which controls the operations of the second latch 454 of the address flip-flop 450.

At $T_3$, after the write address 104 is provided to the internal write address 105, the WCLK 154 changes states (e.g., going high). Referring to FIG. 1, the multiplexer 140 selects the internal write address 105 for the address input 142, in response to the WCLK 154 going high. This allows the address decoder (e.g., row decoder 304 and column decoder 306) to decode the internal write address 105 for the write memory access.

The write port input circuit 120 further includes the data flip-flop 460, which provides the means for receiving the write data 106. The data flip-flop 460 may be configured and clocked in the same fashion as the address flip-flop 450 described above. For example, the data flip-flop 460 may likewise include a first latch and a second latch. The data flip-flop 460 is configured to receive the write data 106 for the write memory access based on the second latch been disconnected from the first latch. In one implementation, the data flip-flop 460 is configured to output the received write data 106 (e.g., provided the data flip-flop 106 to the internal write data 107) in response to the rising edge of the SCLK 458, which controls the operations of the second latch of the data flip-flop 460.

Figure 6:
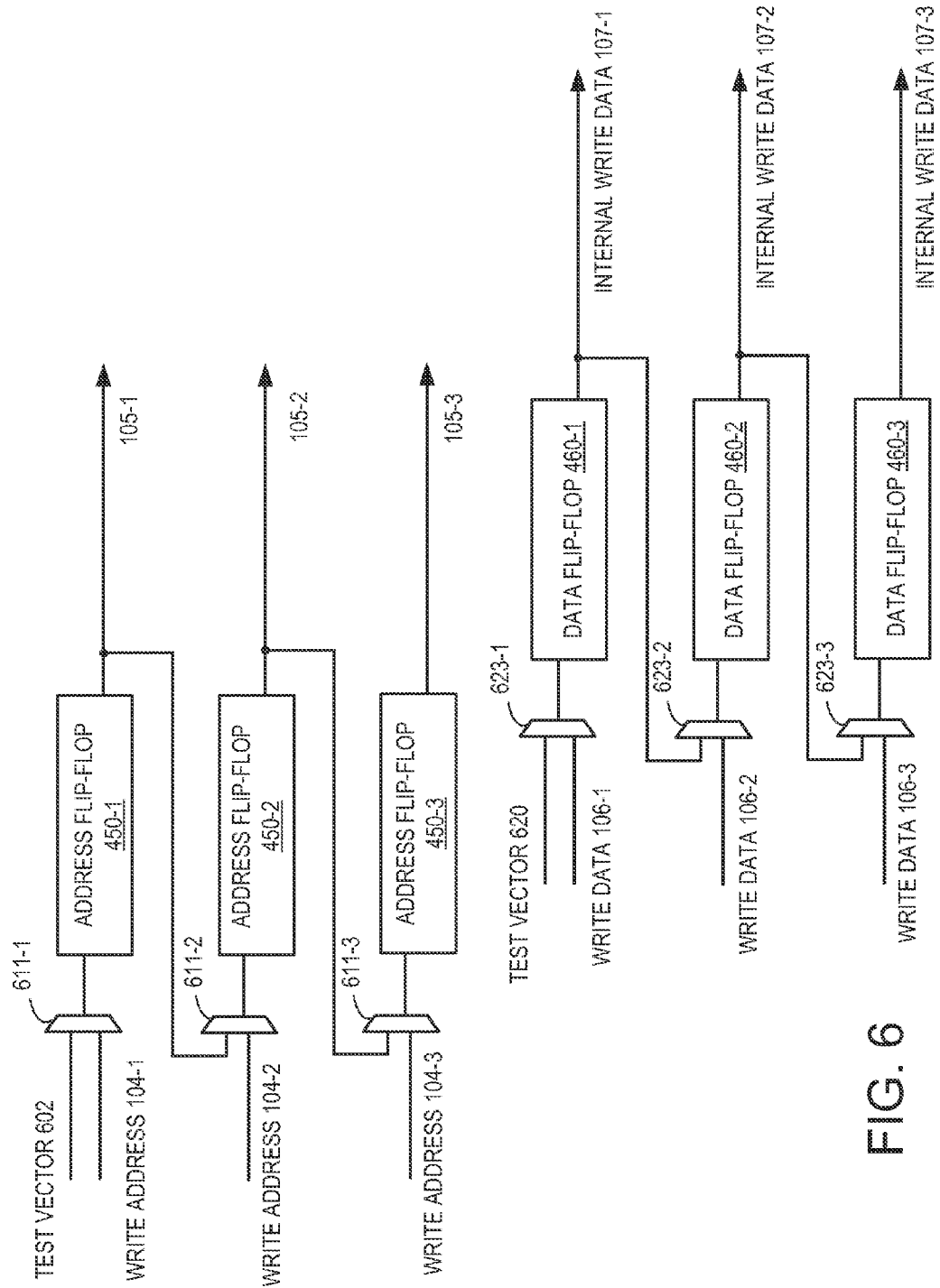
FIG. 6 is a schematic diagram illustrating an exemplary embodiment of an input circuit of a PDP memory.

FIG. 6 is a schematic diagram illustrating an exemplary embodiment of an input circuit of a PDP memory. FIG. 6 illustrates that the write port input circuit 120 may further be configured to receive or latch a test vector. Three instances of the address flip-flop (450-1, 450-2, 450-3) and the data flip-flop (460-1, 460-2, 460-3) are shown, but the scope is not limited thereto. In this example, a test vector is for a scan test to verify that the memory works properly. The test vector 602 (for the scan test) is inputted to a multiplexer 611-1. The multiplexer 611-1 selects the test vector 602 for the scan test. Alternatively, the multiplexer 611-1 selects the write address 104-1 for a regular operation mode. The multiplexer 611-1 provides the selected test vector 602 to the address flip-flop 450-1, which latches and outputs the test vector 602 to the internal write address 105-1 as described above.

In a subsequent cycle, a multiplexer 611-2 selects between the internal write address 105-1 and the write address 104-2. In the test mode, the internal write address 105-1 is selected and provided to the address flip-flop 450-2, which latches and outputs the internal write address 105-1 to the internal write address 105-2 as described above. In subsequent cycles, each of the address flip-flops (450-1, 450-2, 450-3 . . . ) latches the test vector 602 in the process described above.

Each of the data flip-flops (460-1, 460-2, 460-3) latches the test vector 620 in like fashion. The test vector 620 (for the scan test) is inputted to a multiplexer 623-1. The multiplexer 623-1 selects the test vector 620 for the scan test. Alternatively, the multiplexer 623-1 selects the write data 106-1 for a regular operation mode. The multiplexer 623-1 provides the selected test vector 620 to the data flip-flop 460-1, which latches and outputs the test vector 620 to the internal write data 107-1 as described above.

In a subsequent cycle, a multiplexer 623-2 selects between the internal write data 107-1 and the write data 106-2. In the test mode, the internal write data 107-1 is selected and provided to the data flip-flop 460-2, which latches and outputs the internal write data 107-1 to the internal write data 107-2 as described above. In subsequent cycles, each of the data flip-flops (460-1, 460-2, 460-3 . . . ) latches the test vector 620 in the process described above.

Figure 7:
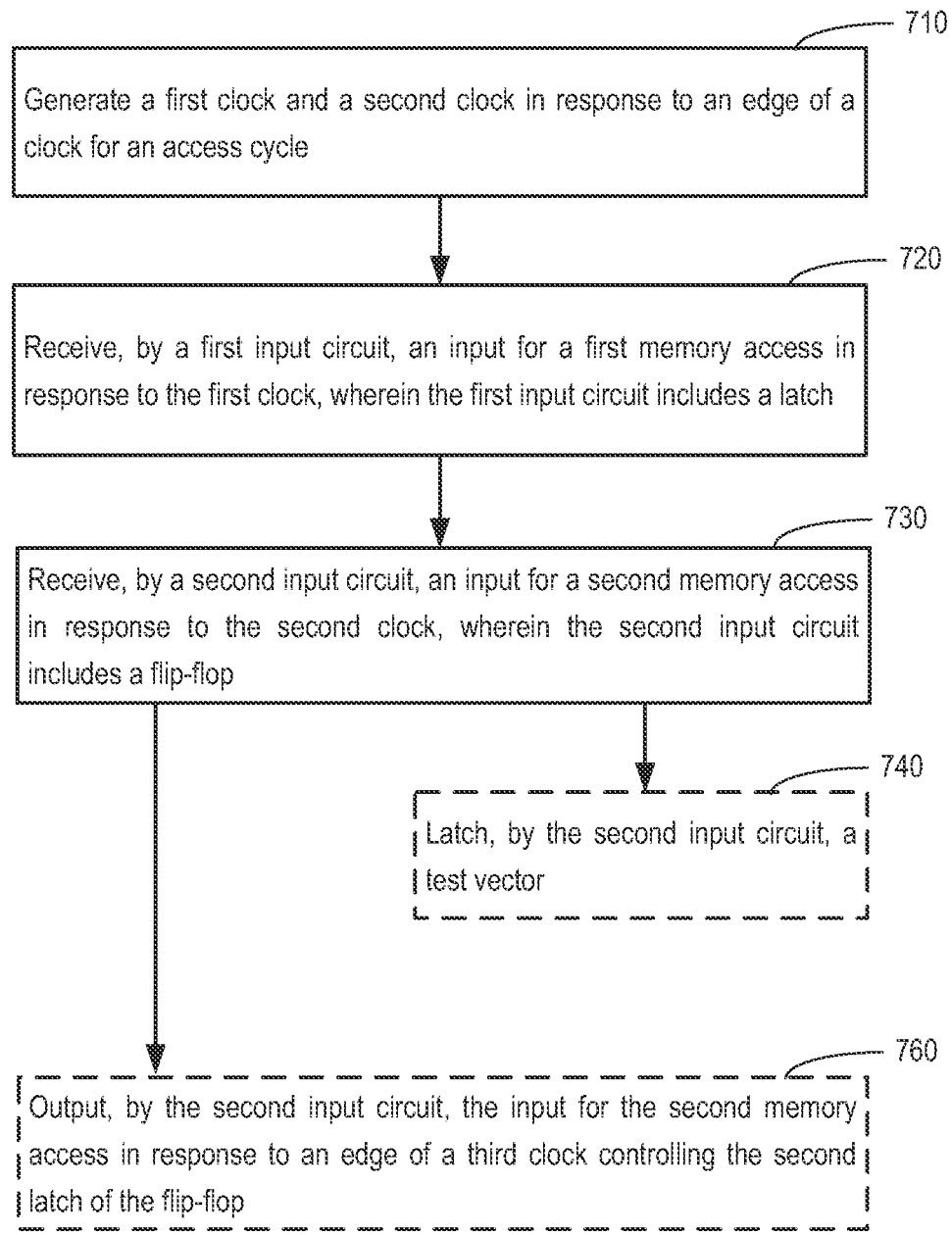
FIG. 7 is a flowchart of operations of an exemplary embodiment of a PDP memory.

FIG. 7 is a flowchart of operations of a PDP memory. The steps drawn in dotted lines may be optional. At 710, a first clock and a second clock are generated in response to an edge of a clock for an access cycle. For example, the control circuit 130 generates the clock signal ACLK 156 and the clock signal BCLK 158 in response to the rising edge of the MCLK 150 (FIG. 5). At 720, an input for a first memory access is received by a first input circuit in response to the first clock, wherein the first input circuit includes a latch. For example, the read port input circuit 110 receives the read address 102 in response to the clock signal ACLK 156 (FIG. 5). The read port input circuit 110 includes the latch 410 (FIG. 4). At 730, an input for a second memory access is received by a second input circuit in response to the second clock. The second input circuit includes a flip-flop. For example, the write port input circuit 120 receives the write address 104 in response to the clock signal BCLK 158 (FIG. 5). The write port input circuit 120 includes the address flip-flop 450 and the data flip-flop 460 (FIG. 4). At 740, a test vector is latched by the second input circuit. For example, the write port input circuit 120 latches the test vector 602 and the test vector 620 (FIG. 6). At 760, the input for the second memory access is outputted, by the second input circuit, in response to an edge of a third clock controlling the second latch of the flip-flop. For example, the write port input circuit 120 outputs the received write address 104 and write data 106 (to the internal write address 105 and the internal write data 107, respectively) in response to the rising edge of the SCLK 458 (FIGS. 4 and 5). The SCLK 458 controls, e.g., the second latch 454 of the address flip-flop 450. Examples of these operations are further described in association with FIGS. 1-6.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A memory comprising:
 a control circuit configured to generate a first clock and a second clock in response to an edge of a clock for an access cycle;
 a first input circuit configured to receive an input for a first memory access based on the first clock, wherein the first input circuit includes a latch; and
 a second input circuit configured to receive an input for a second memory access, the second memory access being after the first memory access, based on the second clock, wherein the second input circuit includes a flip-flop,
  wherein the first input circuit latches the input for the first memory access in response to a transition of the first clock, and
  the second input circuit latches the input for the second memory access in response to a transition of the second clock, while the input for the first memory access is latched.

2. The memory of claim 1, wherein the second memory access is subsequent to the first memory access in the access cycle.

3. The memory of claim 2, Wherein the second memory access is a write memory access.

4. The memory of claim 3, wherein the input for the second memory access includes write data.

5. The memory of claim 4, wherein the first memory access is a read memory access.

6. The memory of claim 4, wherein the flip-flop comprises a first latch of the flip-flop and a second latch of the flip-flop.

7. The memory of claim 6, wherein the second input circuit is configured to receive the input for the second memory access further based on the second latch of the flip-flop being disconnected from the first latch of the flip-flop.

8. The memory of claim 6, wherein the second input circuit is configured to output the input for the second memory access in response to an edge of a third clock controlling the second latch of the flip-flop.

9. A memory comprising:
a control circuit configured to generate a first clock and a second clock in response an edge of a clock for an access cycle;
a first input circuit configured to receive an input for a first memory access based on the first clock, wherein the first circuit includes a latch; and
a second input circuit configured to receive an input for a second memory access based on the second clock, wherein the second input circuit includes a flip-flop, and the second clock is no later than the first clock,
wherein the second memory access is subsequent to the first memory access in the access cycle,
wherein the second memory access is a write memory access,
wherein the input for the second memory access includes write data
wherein the first memory access is a read memory access,
wherein the flip-flop comprises a first latch of the flip-flop and a second latch of the flip-flop, and
wherein the second input circuit is configured to receive a test vector.

10. A memory comprising:
a control means for generating a first clock and a second clock in response to an edge of a clock for an access cycle;
a first input means for receiving an input for a first memory access based on the first clock, wherein the first input means includes a latch; and
a second input means or receiving an input for a second memory access, the second memory access being after the first memory access based on the second clock, wherein the second input means includes a flip-flop, wherein the first input means latches the input for the first memory access in response to a transition of the first clock, and
the second input means latches the input for the second memory access in response to a transition of the second clock, while the input for the first memory access is latched.

11. The memory of claim 10, wherein the second memory access is subsequent to the first memory access in the access cycle.

12. The memory of claim 11, wherein the second memory access is a write memory access.

13. The memory of claim 12, wherein the input for the second memory access includes write data.

14. The memory of claim 13, wherein the first memory access is a read memory access.

15. The memory of claim 13, wherein the flip-flop comprises a first latch of the flip-flop and a second latch of the flip-flop.

16. The memory of claim 15, wherein the second input means is configured to receive the input for the second memory access further based on the second latch of the flip-flop been disconnected from the first latch of the first flip-flop.

17. The memory of claim 15, wherein the second input means is configured to output the input for the second memory access in response to an edge of a third clock controlling the second latch of the flip-flop.

18. A memory comprising:
a control means for generating a first clock and a second clock in response an edge of a clock for an access cycle;
a first input means for receiving an input for a first memory access based on the first clock, wherein the first input means includes a latch; and
a second input means or receiving an input for a second memory access based on the second clock, wherein the second input means includes a flip-flop, and the second clock is no later than the first clock,
wherein the second memory access is subsequent to the first memory access in the access cycle,
wherein the second memory access is a write memory access,
wherein the input for the second memory access includes write data,
wherein the first memory access is a read memory access,
wherein the flip-flop comprises a first latch of the flip-flop and a second latch of the flip-flop, and
wherein the second input means is configured to latch a test vector.

19. A method of operating a memory, comprising:
generating a first clock and a second clock in response to an edge of a clock for an access cycle;
receiving, by a first input circuit, an input for a first memory access based on the first clock, wherein the first input circuit includes a latch;
receiving, by a second input circuit, an input for a second memory access, the second memory access being after the first memory access, based on the second clock, wherein the second input circuit includes a flip-flop;
latching, by the first input circuit, the input for the first memory access in response to a transition of the first clock, and
latching, by the second input circuit, the input for the second memory access in response to a transition of the second clock, while the input for the first memory access is latched.

20. The method of claim 19, wherein the second memory access is subsequent to the first memory access in the access cycle.

21. The method of claim 20, wherein the second memory access is a write memory access.

22. The method of claim 21, wherein the input for the second memory access includes write data.

23. The method of claim 2 wherein the first memory access is a read memory access.

24. The method of claim 22, wherein the -flop comprises a first latch of the flip-flop and a second latch of the flip-flop.

25. The method of claim 24, wherein the receiving the input for the second memory access is further based on the second latch of the flip-flop been disconnected from the first latch of the flip-flop.

26. The method of claim 24, further comprises outputting, by the second input circuit, the input for the second memory access in response to an edge of a third clock controlling the second latch of the flip-flop.

27. A method of operating a memory, comprising;
generating a first clock and a second clock in response to an edge of a clock for an access cycle;
receiving, by a first input circuit, an input for a first memory access based on the first clock, wherein the first input circuit includes a latch; and receiving, by a second input circuit, an input for a second memory access based on the second clock, wherein the second input includes a flip-flop, and the second clock is no later than the first clock,
wherein the second memory access is subsequent to the first memory access in the access cycle,
wherein the second memory access is a write memory access,
wherein the input for the second memory access includes write data,
wherein the first memory access is a read memory access,
wherein the first flip-flop comprises a first latch of the flip-flop and a second latch of the flip-flop; and
latching, by the second input circuit, a test vector.

* * * * *